(12) United States Patent
Keup

(10) Patent No.: US 12,538,386 B2
(45) Date of Patent: Jan. 27, 2026

(54) CIRCUIT UNIT AND METHOD FOR CONTROLLING LOAD CURRENTS

(71) Applicant: Volkswagen Aktiengesellschaft, Wolfsburg (DE)

(72) Inventor: Thomas Keup, Burgdorf (DE)

(73) Assignee: VOLKSWAGEN AKTIENGESELLSCHAFT, Wolfsburg (DE)

(*) Notice: Subject to any disclaimer, the term of this patent is extended or adjusted under 35 U.S.C. 154(b) by 1069 days.

(21) Appl. No.: 17/291,274

(22) PCT Filed: Oct. 11, 2019

(86) PCT No.: PCT/EP2019/077642
§ 371 (c)(1),
(2) Date: May 4, 2021

(87) PCT Pub. No.: WO2020/094332
PCT Pub. Date: May 14, 2020

(65) Prior Publication Data
US 2022/0007463 A1 Jan. 6, 2022

(30) Foreign Application Priority Data
Nov. 5, 2018 (DE) .................. 10 2018 218 785.1

(51) Int. Cl.
*H05B 1/02* (2006.01)
*B60N 2/56* (2006.01)
(Continued)

(52) U.S. Cl.
CPC ......... *H05B 1/0238* (2013.01); *B60N 2/5685* (2013.01); *B62D 1/06* (2013.01); *G05F 1/625* (2013.01)

(58) Field of Classification Search
CPC ........ G05F 1/625; H03K 17/168; H03K 7/08; H03K 4/026; B62D 1/06; B62D 1/065;
(Continued)

(56) References Cited

U.S. PATENT DOCUMENTS 2,999,202 A * 9/1961 Ule .......................... H03H 7/24
235/443
4,994,733 A * 2/1991 Yasunaga ............. G01R 15/002
324/126
(Continued)

FOREIGN PATENT DOCUMENTS

| CN | 1372372 A | 6/2007 | ............. G02F 1/133 |
| CN | 102183949 A | 9/2011 | ............. G05B 23/02 |

(Continued)

OTHER PUBLICATIONS

Chinese Office Action, Application No. 201980081225.5, 16 pages, Jan. 19, 2024.
(Continued)

*Primary Examiner* — Eric S Stapleton
(74) *Attorney, Agent, or Firm* — Slayden Grubert Beard PLLC

(57) ABSTRACT

The invention relates to a circuit unit for controlling load currents of an electrical load, comprising a circuit logic, at least n switch elements with n≥2, resistance elements with m≥1, wherein the resistance elements can be bridged by means of the switch elements, wherein the circuit logic is designed such that it increases the load current in steps to a final value by means of an activation sequence of the switch elements, and a method for controlling load currents of an electrical load.

9 Claims, 1 Drawing Sheet

(51) Int. Cl.
*B62D 1/06* (2006.01)
*G05F 1/625* (2006.01)
*H03K 17/16* (2006.01)

(58) Field of Classification Search
CPC .. H05B 1/0238; B60N 2/5685; G01R 33/098; G01R 33/09; G01R 21/06; G01R 21/08; G01R 33/07; G01R 33/093; G01R 33/091; G01R 15/207; H03M 1/664; H03M 1/58; H03M 1/123; H03M 1/56; H04N 25/78
USPC .... 219/204, 50, 55, 61.2, 67, 76.17, 130.01, 219/209, 260, 406–408, 414, 423–427, 219/435, 483, 484, 504, 505, 539, 541; 327/350, 351, 365, 482–492, 540; 338/179, 195–200, 333, 334; 323/350–354
See application file for complete search history.

(56) References Cited

U.S. PATENT DOCUMENTS

| | | | | |
|---|---|---|---|---|
| 5,363,070 A | * | 11/1994 | Arimoto | H03H 7/24 323/353 |
| 8,108,162 B2 | * | 1/2012 | Matsumoto | G01R 31/343 702/65 |
| 8,810,354 B2 | * | 8/2014 | Govindasamy | H01C 10/16 338/334 |
| 2002/0130708 A1 | * | 9/2002 | Hohenwarter | H02M 3/07 327/540 |
| 2008/0296473 A1 | * | 12/2008 | Yamaoka | H03K 4/023 323/350 |
| 2009/0234600 A1 | * | 9/2009 | Matsumoto | G01R 31/343 323/354 |
| 2011/0114827 A1 | * | 5/2011 | Yamaoka | H04N 25/75 250/214 R |
| 2019/0031060 A1 | * | 1/2019 | Rappl | B60H 1/246 |

FOREIGN PATENT DOCUMENTS

| | | | |
|---|---|---|---|
| CN | 108473074 A | 8/2018 | ............... B60H 1/24 |
| DE | S 32 94 M | 5/1952 | |
| DE | 8600660 U1 | 5/1986 | ............. G03B 21/132 |
| DE | 10146900 A1 | 4/2003 | ............. H02M 1/088 |
| DE | 102018218785 A1 | 5/2020 | ............. H02M 3/06 |
| EP | 1414143 A2 | 4/2004 | ............... H02J 1/00 |
| JP | 03611672 B2 | 1/2005 | ............... G05F 1/10 |
| WO | 2017/137023 A1 | 8/2017 | ............... B60H 1/24 |
| WO | 2020/094332 A1 | 5/2020 | ............... H02K 17/16 |

OTHER PUBLICATIONS

German Office Action, Application No. 102018218785.1, 8 pages, Feb. 21, 2024.
German Office Action, Application No. 102018218785.1, 6 pages, Aug. 5, 2019.
International Search Report and Written Opinion, Application No. PCT/EP2019/077642, 9 pages, Jan. 23, 2020.

* cited by examiner

CIRCUIT UNIT AND METHOD FOR CONTROLLING LOAD CURRENTS

CROSS-REFERENCE TO RELATED APPLICATIONS

This application claims priority to German Patent Application No. DE 10 2018 218 785.1, filed on Nov. 5, 2018 with the German Patent and Trademark Office. The contents of the aforesaid Patent Application are incorporated herein for all purposes.

TECHNICAL FIELD

The invention relates to a circuit unit and a method for controlling load currents of an electrical load.

BACKGROUND

This background section is provided for the purpose of generally describing the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

There is a wide variety of methods for controlling electrical loads.

Often, driver stages are used for this purpose that are activated by a circuit logic, which then generate largely square-wave voltages and currents with steep edges. The power control then takes place by means of a pulse width modulation (PWM). In order to keep the power dissipation input into the drivers, which are mostly designed as semiconductor components, low, these have particularly steep circuit-on and circuit-off edges. These rapid current changes form a broad current spectrum in the technical view of the spectral range and thereby cause increased magnetic fields.

SUMMARY

An object exists to establish a circuit unit for controlling load currents by means of which smaller magnetic fields are generated, and to provide an associated method for controlling load currents.

The object is solved by a circuit and a method having the features the independent claims. Embodiments of the invention are discussed in the dependent claims and the following description.

DESCRIPTION

Figure 1:
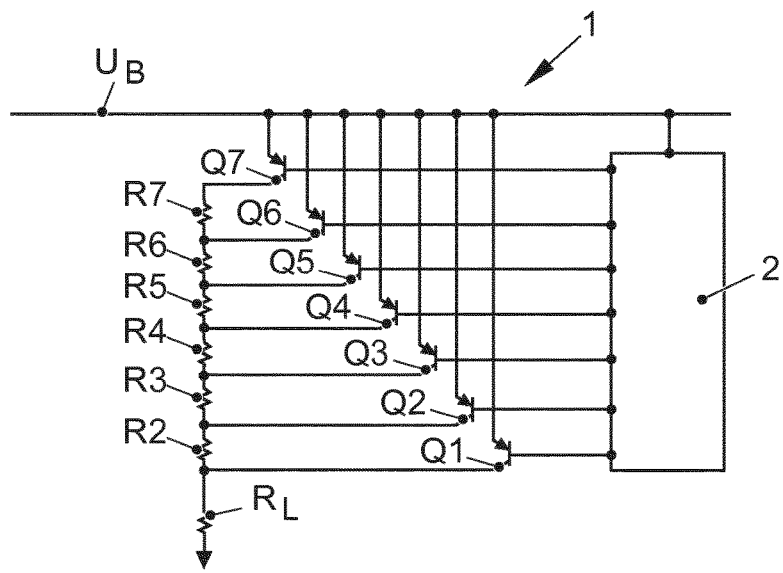
FIG. 1 shows a schematic exemplary circuit arrangement of a circuit unit for controlling load currents of an electrical load.

The details of one or more embodiments are set forth in the accompanying drawings and the description below. Other features will be apparent from the description, drawings, and from the claims.

In the following description of embodiments of the invention, specific details are described in order to provide a thorough understanding of the invention. However, it will be apparent to one of ordinary skill in the art that the invention may be practiced without these specific details. In other instances, well-known features have not been described in detail to avoid unnecessarily complicating the instant description.

The circuit unit for controlling load currents of an electrical load comprises a circuit logic, at least n switch elements with $n \geq 2$, as well as m resistance elements with $m \geq 1$, wherein resistance elements can be bridged by means of switch elements, wherein the circuit logic is designed such that the load current is increased in steps to a final value by means of an activation sequence of the switch elements. Thereby, the current gradient is reduced accordingly, and thus the development of magnetic fields is limited. In this context, the resistance elements are for example ohmic resistance elements. However, embodiments where the resistance elements are formed by active semiconductors are also conceivable. The number of switch elements in this context can be the same as the number of the resistance elements but it may also be greater or smaller. In some embodiments, the number of the switch elements is greater by one than the number of the resistance elements. The number of the switch elements is dependent in this context on how small the steps are by which the load current is to be increased. A good trade-off between circuit complexity and current gradient limitation is at $4 \leq n \leq 12$. The resistance elements may in this context be switched in series or in parallel. However, combined series and parallel circuits are also conceivable. For example, the resistance elements are, however, arranged in series in the shape of a resistance chain.

The switch elements may be for example transistors that are for example designed as MOSFET, IGBT, or bipolar transistors.

In some embodiments, the circuit logic is furthermore designed in such a way that an activation sequence of the switch elements lowers the load current in steps to a final value such that the current gradient is reduced not only when the load current is switched on, but also when it is switched off.

In other embodiments, the switch elements each have an input terminal, an output terminal, and a control terminal, wherein the input terminals of the switch elements are connected to a supply voltage terminal, the control terminals are connected to the circuit logic, and the output terminals are routed to different positions of a series connection circuit of resistance elements. Thus, one resistance element after the other can be bridged until finally the last switch element connects the electrical load to the supply voltage terminal. In this context, it is possible in principle that the switch elements are switched through and remain switched through when the load current is switched on. The benefit is that the load current can be enlarged in this manner.

In some embodiments, the activation sequence is designed such that only one switch element each is switched through at a time. However, there may be an overlap in the switching phases, such that two switch elements are switched through for a brief time. For example, it may be provided that first the one switch element is switched through before the previously switched-through switch element is switched to an off state or respectively cut off.

In some embodiments, however, all switch elements may be switched through successively, as mentioned above, with these switch elements all remaining switched through.

In some embodiments, the electrical load is a heating element, for example a vehicle seat heater, and/or a steering wheel heater.

The invention will be explained in the following in more detail with reference to further example embodiments.

Specific references to components, process steps, and other elements are not intended to be limiting. Further, it is understood that like parts bear the same or similar reference numerals when referring to alternate FIGS. It is further noted that the FIGS. are schematic and provided for guidance to the skilled reader and are not necessarily drawn to scale. Rather, the various drawing scales, aspect ratios, and numbers of components shown in the FIGS. may be purposely distorted to make certain features or relationships easier to understand.

FIG. 1 shows a circuit arrangement of a circuit unit 1 for controlling load currents of an electrical load $R_L$. The circuit unit 1 has a logic unit 2, seven switch elements Q1-Q7, and six resistance elements R2-R7. The resistance elements R2-R7 are switched in series and are connected to the electrical load $R_L$. The other end of the resistance chain is connected to the output terminal of the seventh switch element Q7. The switch elements Q1-Q7 are designed as PNP transistors in the exemplary embodiment shown. The control inputs or respectively base terminals of the switch elements Q1-Q7 are connected to the circuit logic 2, wherein the input terminals or respectively emitter terminals are connected to a supply voltage $U_B$. The output terminals or respectively collector terminals are routed to different positions of the resistance chain. In the following, it will be assumed that all resistance elements R2-R7 have the same ohmic resistance, which is, however, not mandatory. Furthermore, it will be assumed that $U_B$ is a constant direct current voltage.

Figure 2:
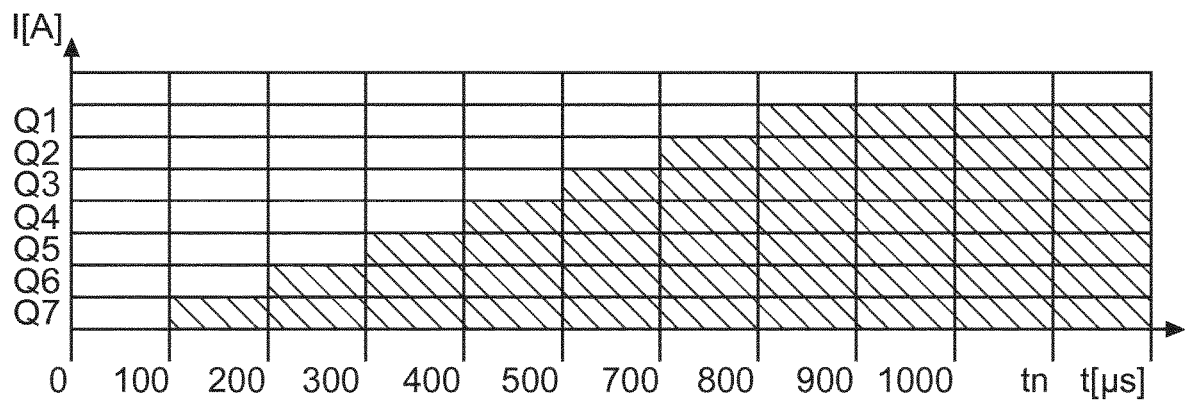
FIG. 2 shows a schematic exemplary representation of the load current over time when the load current is switched on, and FIG. 3 shows a schematic exemplary representation of the load current over time when the load current is switched off.

The functioning of the circuit unit 1 is explained in detail in the following. In the original state, all switch elements Q1-Q7 are in a cutoff state, such that the load current is zero, disregarding cutoff currents. If the load current is to be switched on, the switch element Q7 is activated by the circuit logic 2 in a first step. This is shown at 100 μs in FIG. 2. Disregarding the on-state resistance of the switch element Q7, the series connection circuit of the resistance chain and the electrical load $R_L$ is then connected between the supply voltage $U_B$ and ground, wherein the resistance chain limits the load current to a small value. After 200 μs, the switch element Q6 is then switched through, and the switch element Q7 is put in a cutoff state. The switched-through switch element Q6 has a negligible on-state resistance and bridges the switch element Q7 and the resistance element R7 such that only the series connection circuit of R6-R2 and the electrical load $R_L$ is active.

Accordingly, the load current increases in the next step at 300 ps, the switch element Q6 is put in a cutoff state again, and the switch element Q5 is switched through such that the load current further increases. This is continued until finally, after 800 μs, the switch element Q1 is switched through, and thus the entire resistance chain R2-R7 is bridged and the maximum load current is flowing.

In this context, it must be noted that the switching times need not be uniform. Furthermore, it must be noted that there may also be embodiments where the switch elements Q2-Q7 remain switched on. Through the selection of the resistance elements R2-R7 and the switching times, the shape of the load current increase may be varied in this context.

Figure 3:
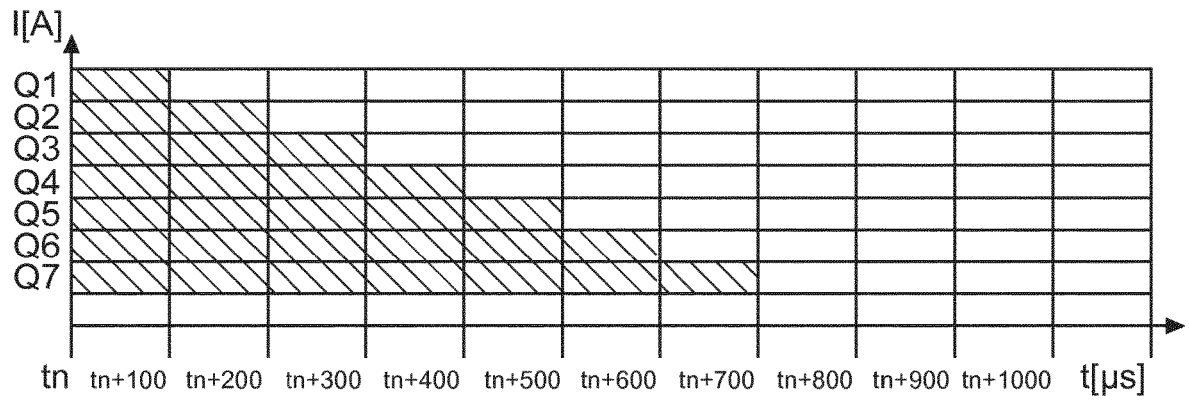

The switching-off of the load current takes place in the reverse order and is explained briefly with reference to FIG. 3. Until the time $t_n+100$ μs, the switch element Q1 is switched through. Then, the switch element Q1 is put in a cutoff state and the switch element Q2 is switched through and so on, such that the load current is lowered in steps until it is completely switched off at the time $t_n+700$ μs.

In this context, it must be noted that the number of the switch elements Q1-Q7 as well as the switching times are merely examples.

In some embodiments, the electrical load $R_L$ is designed as a vehicle seat heater or as a steering wheel heater. Such heaters are typically supplied with current by means of PWM signals. Using the circuit unit 1, such a PWM signal can for example be set, wherein only the rising and falling edges are stepped by the successive switching of the switch elements Q1-Q7. However, the heating output may also be varied by lengthening or shortening individual switching times.

The invention has been described in the preceding using various exemplary embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor, module or other unit or device may fulfill the functions of several items recited in the claims.

The term "exemplary" used throughout the specification means "serving as an example, instance, or exemplification" and does not mean "preferred" or "having advantages" over other embodiments.

The mere fact that certain measures are recited in mutually different dependent claims or embodiments does not indicate that a combination of these measures cannot be used to advantage. Any reference signs in the claims should not be construed as limiting the scope.

What is claimed is:

1. A circuit for controlling load currents of an electrical load, comprising:
    a circuit logic;
    plurality of switch elements;
    a plurality of resistance elements, wherein
        the resistance elements are arranged in series with each other, forming a resistor series arrangement;
        the resistor series arrangement is arranged between a power supply and the electrical load; wherein
        at least one of the resistance elements can be bridged by switching on at least one of the switch elements, wherein
        the circuit logic is configured to increase the load current through the electrical load in steps up to a final value by an activation sequence of the switch elements, which activation sequence decreases the number of resistance elements between the power supply and the electrical load; wherein
        an overlap is provided in the activation sequence such that a second of the switch elements is switched on before a previously activated first of the switch elements is switched off.

2. The circuit of claim 1, wherein the circuit logic is configured such that it lowers the load current in steps to a final value by another sequence of the switch elements.

3. The circuit of claim 2, wherein the electrical load is a resistive heating element.

4. The circuit of claim 3, wherein the heating element is configured as a vehicle seat heater and/or a steering wheel heater.

5. The circuit of claim 1, wherein the electrical load is a resistive heating element.

6. The circuit of claim 5, wherein the heating element is configured as a vehicle seat heater and/or a steering wheel heater.

7. A vehicle with the circuit for controlling load currents of an electrical load of claim 1.

8. A method for controlling a load current of an electrical load with a plurality of resistance elements, arranged in series with each other forming a resistor series arrangement and a plurality of switch elements, the resistor series arrangement being arranged between a power supply and the electrical load, the method comprising:

increasing, during an activation sequence, a load current through the electrical load in steps up to a final value by controlling the switch elements, wherein the activation sequence decreases the number of resistance elements between the power supply and the electrical load, wherein the switch elements are controlled such that a second of the switch elements is switched on before a previously activated first of the switch elements is switched off.

9. The method of claim 8, wherein another sequence is selectively conducted, which lowers the load current in steps.

* * * * *